United States Patent
Kang

(10) Patent No.: US 7,855,687 B2
(45) Date of Patent: Dec. 21, 2010

(54) PRINTED CIRCUIT BOARD, DISPLAY DEVICE HAVING THE SAME AND A METHOD THEREOF

(75) Inventor: Byeong-Soo Kang, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 594 days.

(21) Appl. No.: 11/838,271

(22) Filed: Aug. 14, 2007

(65) Prior Publication Data

US 2008/0074334 A1 Mar. 27, 2008

(30) Foreign Application Priority Data

Sep. 27, 2006 (KR) .................. 10-2006-0094277

(51) Int. Cl.
*H01Q 1/24* (2006.01)
(52) U.S. Cl. .................. 343/702; 343/700 MS
(58) Field of Classification Search .......... 343/700 MS, 343/702, 725, 767, 770, 846
See application file for complete search history.

(56) References Cited

U.S. PATENT DOCUMENTS

| | | | |
|---|---|---|---|
| 6,509,877 B2* | 1/2003 | Masaki | 343/702 |
| 6,728,559 B2* | 4/2004 | Masaki | 455/575.5 |
| 6,809,690 B2* | 10/2004 | Tao | 343/702 |
| 6,980,159 B2* | 12/2005 | Sun et al. | 343/702 |
| 7,068,229 B2* | 6/2006 | Lin | 343/702 |
| 7,508,680 B2* | 3/2009 | Lee et al. | 361/765 |
| 2004/0264119 A1* | 12/2004 | Hirota | 361/683 |

FOREIGN PATENT DOCUMENTS

| | | |
|---|---|---|
| JP | 2000172376 | 6/2000 |
| KR | 1020040028370 | 4/2004 |
| KR | 1020050092258 | 9/2005 |
| KR | 1020060010259 | 2/2006 |

\* cited by examiner

*Primary Examiner*—Douglas W Owens
*Assistant Examiner*—Chuc D Tran
(74) *Attorney, Agent, or Firm*—Cantor Colburn LLP

(57) ABSTRACT

A display device including a display panel and a printed circuit board. The printed circuit board includes an insulating layer, a circuit wire portion, an antenna arranged on the insulating layer and a connection wire portion. The insulating layer includes a base portion and a protruding portion protruded from a side of the base portion. The circuit wire portion is arranged on the base portion. The antenna is arranged on the protruding portion and insulated from the circuit wire portion. The connection wire portion is arranged on the base portion and electrically connected to the antenna. The antenna is exposed outside of the display panel.

12 Claims, 7 Drawing Sheets

PRINTED CIRCUIT BOARD, DISPLAY DEVICE HAVING THE SAME AND A METHOD THEREOF

This application claims priority to Korean Patent Application No. 2006-94277, filed on Sep. 27, 2006, and all the benefits accruing therefrom under 35 U.S.C. §119, the contents of which are herein incorporated by reference in its entirety.

BACKGROUND OF THE INVENTION

1. Field of the Invention

The present invention relates to a printed circuit board and a display device having the printed circuit board. More particularly, the present invention relates to a printed circuit board capable of improving reliability of data communication and a display device having the printed circuit board.

2. Description of the Related Art

A liquid crystal display ("LCD") displays images using a liquid crystal having optical and electrical characteristics, such as refractive index anisotropy and dielectric anisotropy. The LCD has been widely used in various fields of art due to its advanced features such as light weight, thin thickness, low power consumption, and others compared to other display devices such as cathode ray tube ("CRT") and plasma display panel ("PDP").

The LCD is broadly employed in various image processing units, such as television set, notebook computer, monitor, etc., to display data processed in the image processing units. Image processing units that are capable of receiving and transmitting data through a wireless communication network have been researched and developed in accordance with progress of communication technologies.

That is, the image processing units for a wireless data communication include a built-in antenna to receive and transmit data through the antenna. An antenna is arranged adjacent to a circuit portion that drives the image processing units. For example, in a notebook computer, an antenna is positioned adjacent to a keypad that is used to input data or orders by user's operation, and circuit portions that control the image processing units are arranged under the keypad. Since the circuit portions generate a high frequency, a noise occurs in the antenna. Thus, the receiving and transmitting rate of the wireless data communication decreases, and reliability of data communication is deteriorated.

BRIEF SUMMARY OF THE INVENTION

An exemplary embodiment provides a printed circuit board capable of improving reliability of a wireless data communication.

An exemplary embodiment provides a display device having the printed circuit board.

An exemplary embodiment of a printed circuit board includes an insulating layer, a circuit wire portion, an antenna and a connection wire portion.

The insulating layer includes a base portion and a protruding portion protruded from a side of the base portion. The circuit wire portion is arranged on the base portion to receive a first signal from an exterior and output a second signal for a drive of an external device. The antenna is arranged on the protruding portion and insulated from the circuit wire portion to receive and transmit data through a wireless communication network. The connection wire portion is arranged on the base portion and electrically connected to the antenna to receive the data from the antenna and transmit the data to the antenna.

In an exemplary embodiment, the printed circuit board further includes a main connector mounted on the base portion and electrically connected to the circuit wire portion to receive the first signal and provide the first signal to the circuit wire portion, and an inspection connector mounted on the base portion and electrically connected to the circuit wire portion to receive an inspection signal for an inspection of an external device and provide the inspection signal to the circuit wire portion.

In an exemplary embodiment, the connection wire portion is electrically connected to either the main connector or the inspection connector.

In an exemplary embodiment, the insulating layer may include a plurality of protruding portions, and the antenna is arranged on each of the protruding portions. The printed circuit board may further include a sub connector mounted on one of the plurality of the protruding portions and electrically connected to the antenna arranged on the protruding portion on which the sub connector is arranged, and the antenna connected to the sub connector is insulated from the connection wire portion.

An exemplary embodiment of a display device includes a display panel and a first printed circuit board.

The display panel receives a control signal corresponding to images to display the images. The first printed circuit board includes an insulating layer, a circuit wire portion, an antenna and a connection wire portion. The insulating layer includes a base portion and a protruding portion protruded from a side of the base portion. The circuit wire portion is arranged on the base portion to receive an image signal corresponding to the image from an exterior and output the control signal. The antenna is arranged on the protruding portion and insulated from the circuit wire portion to receive and transmit data through a wireless communication network. The connection wire portion is arranged on the base portion and electrically connected to the antenna to receive the data from the antenna and transmit the data to the antenna. The antenna is exposed to an outside of the display panel.

In an exemplary embodiment, the display device further includes a receiving container receiving the display panel and a top chassis provided with an insertion recess formed therethrough. The top chassis covers an edge of the display panel to guide a location of the display panel and is combined with the receiving container to fix the display panel to the receiving container. The protruding portion is inserted into the insertion recess, extends to the outside of the display panel, and is positioned at an upper portion or an upper side portion of the display panel in a plane view.

An exemplary embodiment of a display device includes a display panel, a gate driving part and a data printed circuit board.

The display panel receives a data signal and a gate signal corresponding to an image to display the image. The gate driving circuit receives a gate control signal corresponding to the image to output the gate signal to the display panel. The data printed circuit board generates the gate control signal and a data control signal in response to an image signal corresponding to the image, and the data printed circuit board is electrically connected to the display panel.

The data printed circuit board includes an insulating layer, a circuit wire portion, at least one antenna and a connection wire portion. The insulating layer includes a base portion and at least one protruding portion protruded from a side of the base portion. The circuit wire portion is arranged on the base portion to receive the image signal and output the gate control signal and the data control signal. The antenna is arranged on the protruding portion and insulated from the circuit wire portion to receive and transmit data through a wireless communication network. The connection wire portion is arranged on the base portion and electrically connected to the antenna to receive the data from the antenna and transmit the data to the antenna. The antenna is exposed to an outside of the display panel.

An exemplary embodiment of a method of forming a display device displaying images includes forming a display panel receiving a control signal corresponding to the images and displaying the images, forming a printed circuit board and electrically connecting the display panel and the printed circuit board. The forming a printed circuit board includes forming an insulating layer including a base portion and a protruding portion extended from a side of the base portion, arranging a circuit wire portion on the base portion, the circuit wire portion receiving an image signal corresponding to the displayed images from an exterior and outputting the control signal, disposing an antenna on the protruding portion, the antenna receiving and transmitting data through a wireless communication, and arranging a connection wire portion on the base portion, the connection wire portion being electrically connected to the antenna, receiving the data from the antenna, and transmitting the data to the antenna. The electrically connecting the display panel and the printed circuit board includes exposing the antenna to an outside of the display panel.

An exemplary embodiment includes the antenna is arranged outside of the display panel to expose the antenna, and a wire layer is not arranged at upper and under portions of the antenna. Thus, a receiving and transmitting rate of the antenna increases, thereby improving data communication reliabilities.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
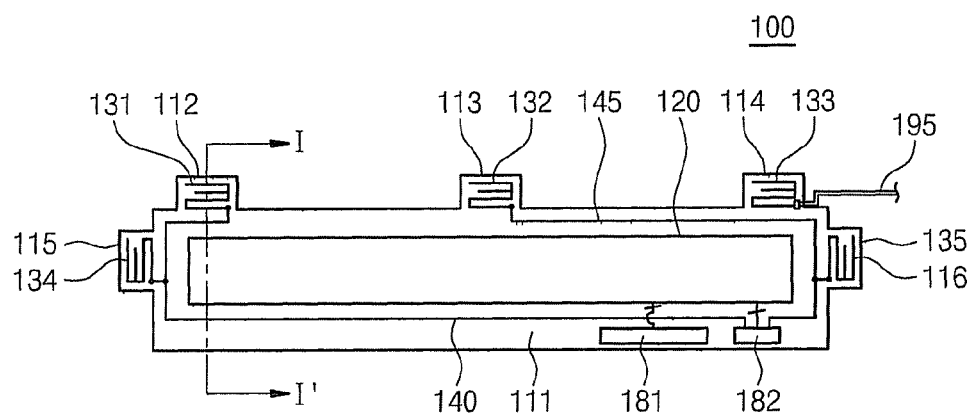
FIG. 1 is a plan view showing an exemplary embodiment of a printed circuit board according to the present invention.

Hereinafter, the present invention will be explained in detail with reference to the accompanying drawings. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
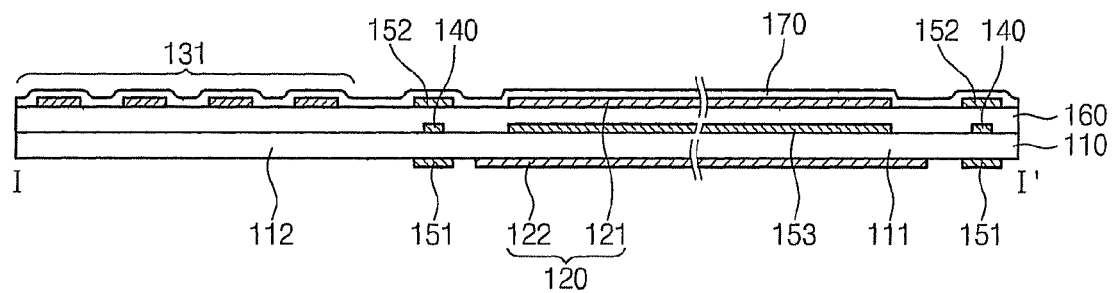
FIG. 2 is a cross-sectional view taken along line I-I' shown in FIG. 1.

FIG. 1 is a plan view showing an exemplary embodiment of a printed circuit board according to the present invention, and FIG. 2 is a cross-sectional view taken along line I-I' shown in FIG. 1.

Referring to FIGS. 1 and 2, a printed circuit board 100 includes a first insulating layer 110, a circuit wire portion 120, an antenna portion and a connection wire portion.

The first insulating layer 110 may be formed from an insulating resin, material such as an epoxy resin, and includes a base portion 111 and a plurality of protruding portions protruded from the base portion 111. The base portion 111 has substantially a plate-like shape. The protruding portions include a first protruding portion 112, a second protruding portion 113, a third protruding portion 114, a fourth protruding portion 115 and a fifth protruding portion 116. The first to fifth protruding portions 112 to 116 are spaced apart from each other on the base portion 111, and each of the first to fifth protruding portions 112 to 116 are protruded from a side of the base portion 111.

The circuit wire portion 120 is arranged in the base portion 111 and receives a first signal to output a second signal. The second signal is used in order to drive an external device that is electrically connected to the circuit wire portion 120. The second signal may include a control signal that controls the external device and/or data that are processed in the external device. The circuit wire portion 120 includes a first circuit wire layer 121 and a second circuit wire layer 122. The first insulating layer 110 is interposed between the first circuit wire layer 121 and the second circuit wire layer 122. In the illustrated embodiment of FIGS. 1 and 2, the first circuit wire layer 121 and the second circuit wire layer 122 are electrically connected to a semiconductor chip (not shown) mounted on the first insulating layer 110. The semiconductor chip receives the first signal through the circuit wire portion 120 and outputs the second signal to the circuit wire portion 120.

The antenna portion is arranged in the first to fifth protruding portions 112 to 116 and receives and transmits a wireless signal, such as through a wireless communication network. In an exemplary embodiment, the antenna portion may be formed from a conductive metal material. The antenna portion includes a first antenna 131, a second antenna 132, a third antenna 133, a fourth antenna 134 and a fifth antenna 135.

In the present exemplary embodiment, the antenna portion includes five antennas 131 to 135. However, in alternative embodiments, the number of antennas may increase or decrease according to size and design of the printed circuit board 100.

The first to fifth antennas 131 to 135 are positioned at (e.g., disposed on) the first to fifth protruding portions 112 to 116, respectively. In the present exemplary embodiment, the first insulating layer 110 includes five protruding portions 112 to 116. However, in alternative embodiments, the number of protruding portions may increase or decrease according to the number of antennas. That is, a quantity of the protruding portions may correspond to a quantity of the antennas.

The first to fifth antennas 131 to 135 are positioned to be insulated from the first and second circuit wire layers 121 and 122. In exemplary embodiments, a conductive metal layer, such as the first and second circuit wire layers 121 and 122, is not arranged on upper and lower portions of the first to fifth antennas 131 to 135. That is, the first to fifth antennas 131 to 135 are independently formed on the first to fifth protruding portions 112 to 116, respectively, in order to minimize influence from the circuit wire portion 120. Advantageously, a noise of the wireless signal received and transmitted through the first to fifth antennas 131 to 135 decreases.

In the present exemplary embodiment, the first to fifth antennas 131 to 135 have substantially a same structure and function, and thus the detailed description of the first antenna 131 among the first to fifth antennas 131 to 135 will be described in detail in order to avoid redundancy.

Figure 3:
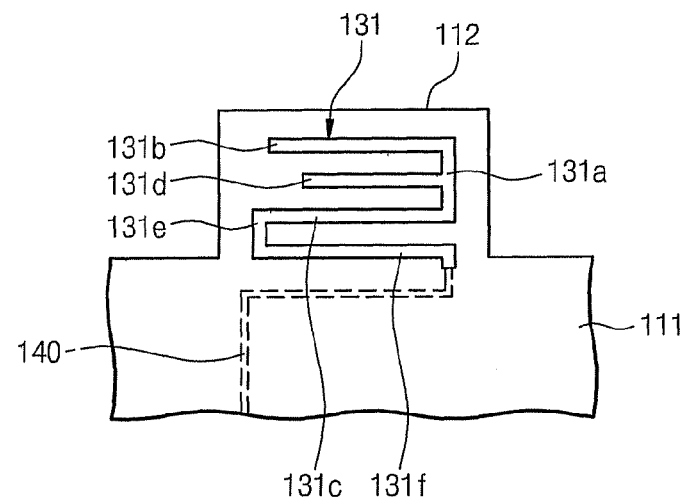
FIG. 3 is a plan view showing an exemplary embodiment of a first antenna of FIG. 1.

FIG. 3 is a plan view showing the first antenna of FIG. 1.

Referring to FIGS. 1 and 3, the first antenna 131 is arranged on the first protruding portion 112. The first antenna 131 includes a first line 131a substantially parallel to a transverse side of the first protruding portion 112, a second line 131b extended from a first end of the first line 131a, a third line 131c extended from a second end of the first line 131a and substantially in parallel with the second line 131b, a fourth line 131d branched from the first line 131a to be positioned between the second line 131b and the third line 131c, a fifth line 131e extended from one end of the third line 131c in a same direction with the first line 131a (e.g., substantially parallel with the first line 131a), and a sixth line 131f extended from one end of the fifth line 131e and substantially in parallel with the fourth line 131d.

The first antenna 131 is electrically connected to the connection wire portion. In exemplary embodiments, the connection wire portion is electrically connected to the first, second, fourth and fifth antennas 131, 132, 134 and 135 to receive the wireless data from the first, second, fourth and fifth antennas 131, 132, 134 and 135. The connection wire portion transmits data to the first, second, fourth and fifth antennas 131, 132, 134 and 135, such that the data is transmitted through the wireless communication network.

The connection wire portion includes a first connection line 140 and a second connection line 145. The first connection line 140 is electrically connected to the first and fourth antennas 131 and 134 to receive and transmit data through the first and fourth antennas 131 and 134. The second connection line 145 is electrically connected to the second and fifth antennas 132 and 135 to receive and transmit data through the second and fifth antennas 132 and 135.

The printed circuit board 100 further includes a first ground layer 151 and a second ground layer 152 grounding the connection wire portion, a third ground layer 153 grounding the circuit wire portion 120, and a second insulating layer 160 interposed between the first circuit wire layer 121 and the third ground layer 153.

The first and second ground layers 151 and 152 are positioned corresponding to the first and second connection lines 140 and 145, and arranged on lower and upper portions of the first and second connection lines 140 and 145, respectively. As used herein, "corresponding" may be used to indicate corresponding in shape, dimension or positional placement relative to another element. For example, as illustrated in the cross-sectional view of FIG. 2, the first and second ground layers 151 and 152 are disposed substantially linearly from an upper portion of the printed circuit board 100 to a lower portion (e.g., along a vertical direction).

Referring to FIG. 2, the first ground layer 151 is arranged on the first insulating layer 110 to allow the first ground layer 151 to be positioned on a same layer as the second circuit wire layer 122 and spaced apart from the second circuit wire layer 122, so that the first ground layer 151 is electrically insulated from the second circuit wire layer 122. The second ground layer 152 is arranged on the second insulating layer 160 to allow the second ground layer 152 to be positioned on a same layer as the first circuit wire layer 121 and spaced apart from the first circuit wire layer 121, so that the second ground layer 152 is electrically insulated from the first circuit wire layer 121. The third ground layer 153 is formed on the first insulating layer 110 and interposed between the first circuit layer 121 and the second circuit wire layer 122 to block (e.g., occupy) a space between the first and second circuit wire layers 121 and 122.

The second insulating layer 160 is formed on the first insulating layer 110 and substantially corresponding to the first insulating layer 110. That is, the second insulating layer 160 covers the first connection line 140 and the third ground layer 153 on the base portion 111, and the second insulating layer 160 insulates the first connection line 140 from the second ground layer 152 and the third ground layer 153 from the first circuit wire layer 121. In the present exemplary embodiment, the first circuit wire layer 121, the first antenna 131 and the second ground layer 152 are formed on the second insulating layer 160. In an exemplary embodiment, the second to fifth antennas 132 to 135 are formed on the second insulating layer 160 in a same manner as the first antenna 131.

The first connection line 140 is insulated from the first ground layer 151 by the first insulating layer 110 and insulated from the second ground layer 152 by the second insulating layer 160. In an exemplary embodiment, the second connection line 145 (shown in FIG. 1) is positioned on a same layer as the first connection line 140 and covered by the second insulating layer 160. Therefore, the second connection line 145 is insulated from the first ground layer 151 by the first insulating layer 110 and insulated from the second ground layer 152 by the second insulating layer 160 in a same manner as the first connection line 140.

In an exemplary embodiment, the second insulating layer 160 may be partially removed to form a via hole therethrough, and the first circuit wire layer 121 and the second circuit wire layer 122 are electrically connected to each other through the via hole.

In FIG. 3, the second ground layer 152 formed on the first connection line 140 has been omitted in order to clearly show a relation between the first antenna 131 and the first connection line 140.

Advantageously, since the first and second connection lines 140 and 145 are blocked by the first and second ground layers 151 and 152, signal interference from the circuit wire portion 120 may decrease.

Figure 4:
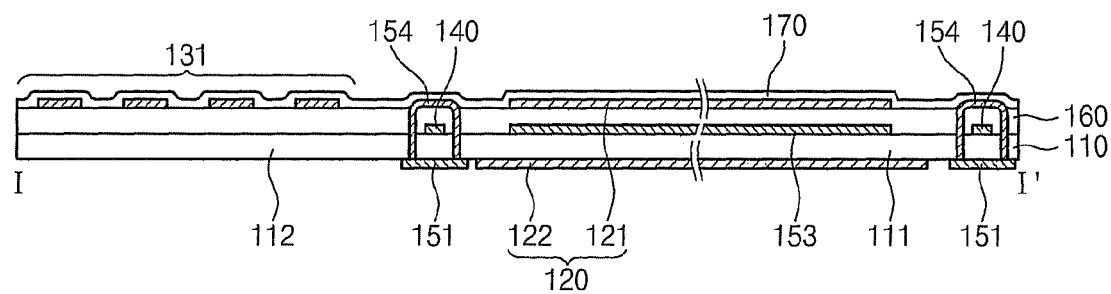
FIG. 4 is a cross-sectional view showing another exemplary embodiment of a second ground layer of FIG. 2.

FIG. 4 is a cross-sectional view showing another exemplary embodiment of the second ground layer of FIG. 2.

Referring to FIG. 4, a second ground layer 154 is formed on the same layer as the first circuit wire layer 121 and spaced apart from the first circuit wire layer 121, so that the second ground layer 154 is electrically insulated from the first circuit wire layer 121. That is, a portion of the second ground layer 154 is formed on the second insulating layer 160 to be insulated from the first connection line 140 and formed corresponding to the first connection line 140. In an exemplary embodiment, the second ground layer 154 is formed corresponding to the second connection line 145 (shown in FIG. 1).

Both ends of the second ground layer 154 are extended along side portions of the first and second connection lines 140 and 145. The ends of the second ground layer 154 are extended substantially parallel to each other, and forming a substantially U-shaped cross-section with the portion of the second ground layer 154 disposed on the second insulating layer 160. The both ends of the second ground layer 154 pass through the second insulating layer 160 and are extended toward the first insulating layer 110 from the upper portion of the second insulating layer 160. In one exemplary embodiment of the present invention, the extended portions of the second ground layer 154 make contact with the first ground layer 151 after passing through the first insulating layer 110. The first and second connection lines 140 and 145 are positioned in a place that is defined by the first and second ground layers 151 and 152 in a cross-sectional view. The first and second connection lines 140 and 145 are disposed between the parallel both ends of the second ground layer 154, and may be considered as being surrounded by the first and second ground layers 151 and 154.

In an exemplary embodiment, the extended portions of the second ground layer 154 may be partially removed in a place where the first and the second connection lines 140 and/or 145 are connected to the antenna portion, so that the second ground layer 154 is insulated from the first and second connection lines 140 and 145.

Referring again to FIG. 2, the printed circuit board 100 further includes a protective layer 170 that protects the first circuit wire layer 121, the second ground layer 152 and the first antenna 131. The protective layer 170 is disposed on the second insulating layer 160 and covers the first circuit wire layer 121, the second ground layer 152 and the first antenna 131 to reduce or effectively prevent corrosion of the first circuit wire layer 121, the second ground layer 152 and the first antenna 131. In an exemplary embodiment, the protective layer 170 covers the second to fifth antennas 132 to 135 and protects the second to fifth antennas 132 to 135, respectively. The protective layer 170 may be formed on an entire of the printed circuit board 100.

Referring again to FIG. 1, the printed circuit board 100 may further include a main connector 181 and an inspection connector 182, which are mounted on the base portion 111. The main connector 181 is mounted on the base portion 111 and electrically connected to the circuit wire portion 120. The main connector 181 receives the first signal and provides the first signal to the circuit wire portion 120. The inspection connector 182 is mounted on the base portion 111 and electrically connected to the circuit wire portion 120. The inspection connector 182 receives an inspection signal for an inspection of an external device (not shown) that is driven by the second signal and provides the inspection signal to the circuit wire portion 120.

The inspection connector 182 is electrically connected to the first and second connection lines 140 and 145, and is also electrically connected to a central processing unit ("CPU", not shown) that stores and processes the wireless data to interface the data between the first connection line 140 and the CPU and between the second connection line 145 and the CPU.

In the present exemplary embodiment, the first and second connection lines 140 and 145 are electrically connected to the inspection connector 182. Alternatively, the first and second connection lines 140 and 145 may be electrically connected to the main connector 181. In case that the first and second connection lines 140 and 145 are electrically connected to the main connector 181, the main connector 181 is electrically connected to the CPU to interface the data between the first connection line 140 and the CPU and between the second connection line 145 and the CPU.

Figure 5:
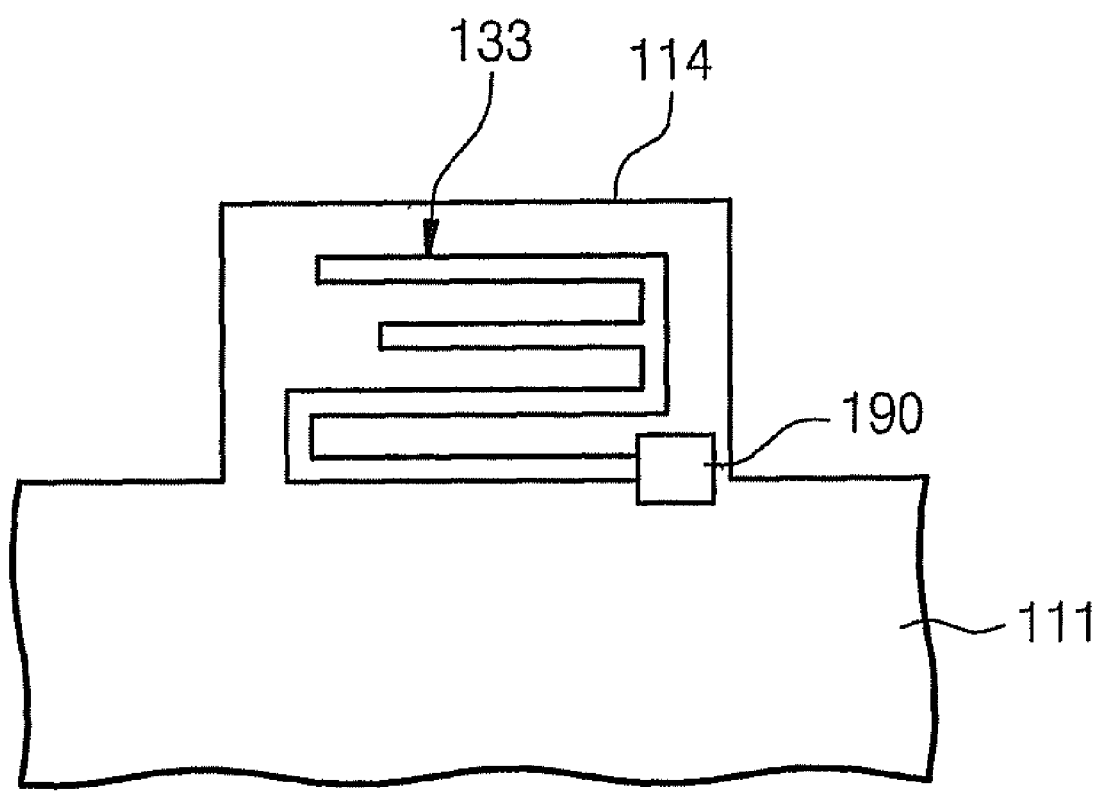
FIG. 5 is a plan view showing an exemplary embodiment of a third antenna of FIG. 1.

FIG. 5 is a plan view showing an exemplary embodiment of the third antenna of FIG. 1.

Referring to FIGS. 1 and 5, the printed circuit board 100 further includes a sub connector 190 that is mounted on the third protruding portion 114 and electrically connected to the third antenna 133. In the present exemplary embodiment, the printed circuit board 100 includes one sub connector 190, however, the number of sub connectors may decrease or increase according to the number of antennas or the size of the printed circuit board 100.

Further, the sub connector 190 is arranged on the third protruding portion 114, however, the sub connector 190 may be arranged on any of the first, second, fourth and fifth protruding portions 112, 113, 115 and/or 116.

The sub connector 190 is electrically connected to an external data processing unit, such as the CPU (not shown) through a coaxial cable 195 and transmits the data received and transmitted between the third antenna 133 and the data processing unit. Advantageously, the printed circuit board 100 may reduce the size of the connection wire portion for data communication with each of the first to fifth antennas 131 to 135, thereby preventing an increase of the size of the connection wire portion and the printed circuit board 100 caused by the increase of the number of antennas.

In an exemplary embodiment, the sub connector 190 may be electrically connected to an external device (not shown) in addition to a device (not shown) on which the printed circuit board 100 is mounted. Advantageously, the external device may perform the wireless data communication through the third antenna 133 even if the external device does not include a separate antenna for the wireless data communication.

Figure 6:
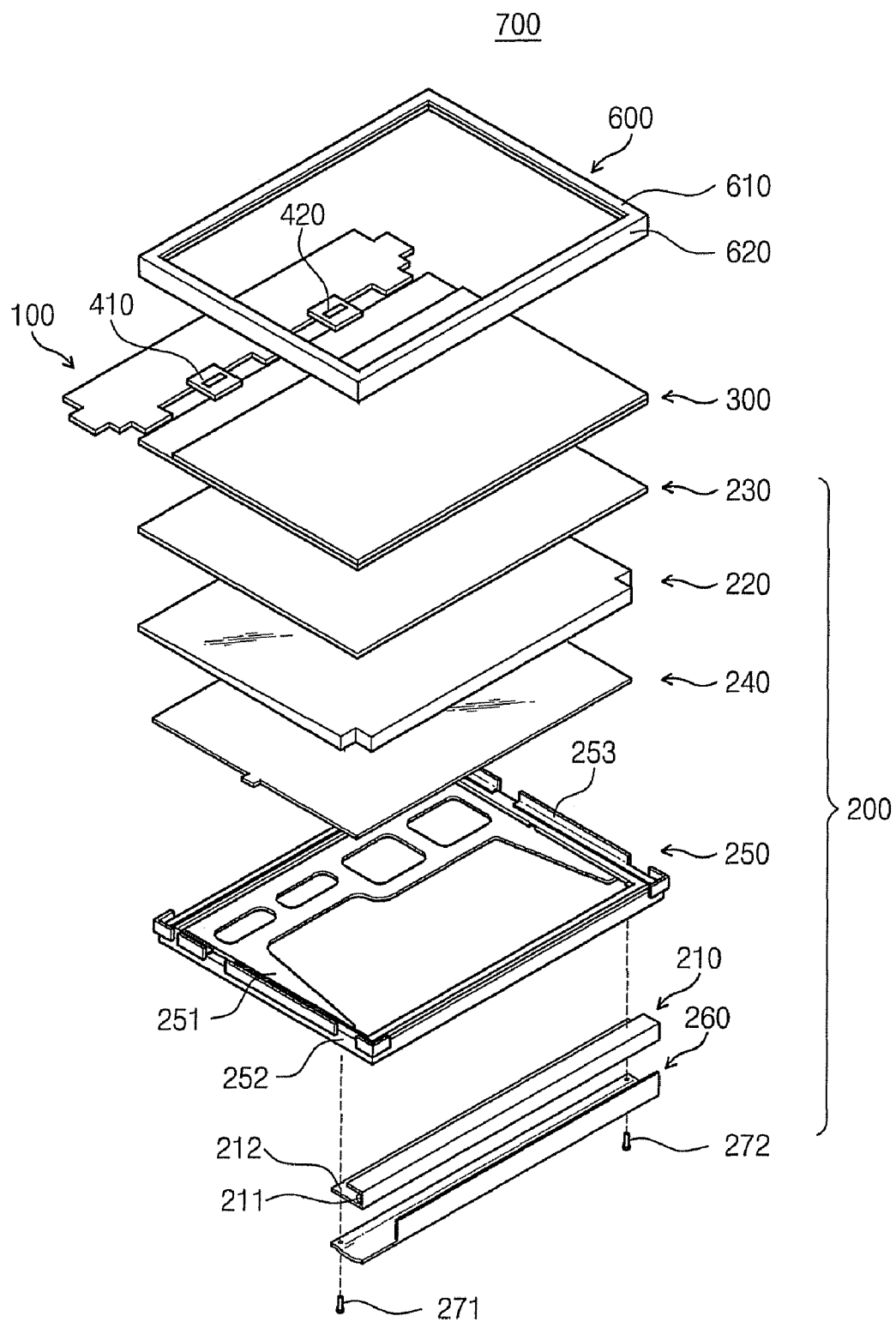
FIG. 6 is an exploded perspective view showing an exemplary embodiment of a display device having a printed circuit board of FIG. 1.

FIG. 6 is an exploded perspective view showing an exemplary embodiment of a display device having the printed circuit board of FIG. 1.

Referring to FIG. 6, a liquid crystal display ("LCD") 700 includes a backlight assembly 200, a liquid crystal display panel 300, a printed circuit board 100, a first tape carrier package ("TCP") 410 and a second TCP 420.

The backlight assembly 200 includes a light-emitting unit 210, a light guide plate 220, at least one optical sheet 230, a reflecting sheet 240 and a receiving container 250.

The light-emitting unit 210 includes a lamp 211 arranged adjacent to one side of the light guide plate 220 to emit a light and a lamp cover 212 receiving the lamp 211 therein and reflecting the light emitted from the lamp 211 to provide the reflected light to the light guide plate 220. The light guide plate 220 changes a path of the light incident thereinto from the light-emitting unit 210 to emit the light as a surface light. The optical sheet 230 is arranged on the light guide plate 220 to improve characteristics of the incident light, such as brightness and uniformity of brightness, from the light guide plate 220. The reflecting sheet 240 is arranged under the light guide plate 220 to upwardly reflect the light leaked from the light guide plate 220.

The receiving container 250 (e.g., a mold frame) receives the light-emitting unit 210, the light guide plate 220, the optical sheet 230 and the reflecting sheet 240 therein. The receiving container 250 includes a bottom plate 251 and a side plate (e.g., sidewalls) 252 upwardly extended from the bottom plate 251 to define a receiving space in which the light-emitting unit 210, the light guide plate 220, the optical sheet 230 and the reflecting sheet 240 are received. The light guide plate 220, the optical sheet 230 and the reflecting sheet 240 are received onto the bottom plate 251, and the liquid crystal display panel 300 is received onto an upper portion of the side plate 252. The receiving container 250 may further include a guide portion 253 that is extended from the upper portion of the side plate 252 to guide a position of the liquid crystal display panel 300.

The backlight assembly 200 may further include a back cover 260 that is arranged outside of the receiving container 250 (e.g., on a rear surface thereof). The back cover 260 may be formed from a metallic material to emit a heat generated from the light-emitting unit 210. In an exemplary embodiment, the back cover 260 may be combined with the receiving container 250, such as using screws 271 and 272, and fixes the light-emitting unit 210 to the receiving container 250. Alternatively, the receiving container 250, with or without the back cover 260, may be received into a bottom chassis (not shown).

Figure 7:
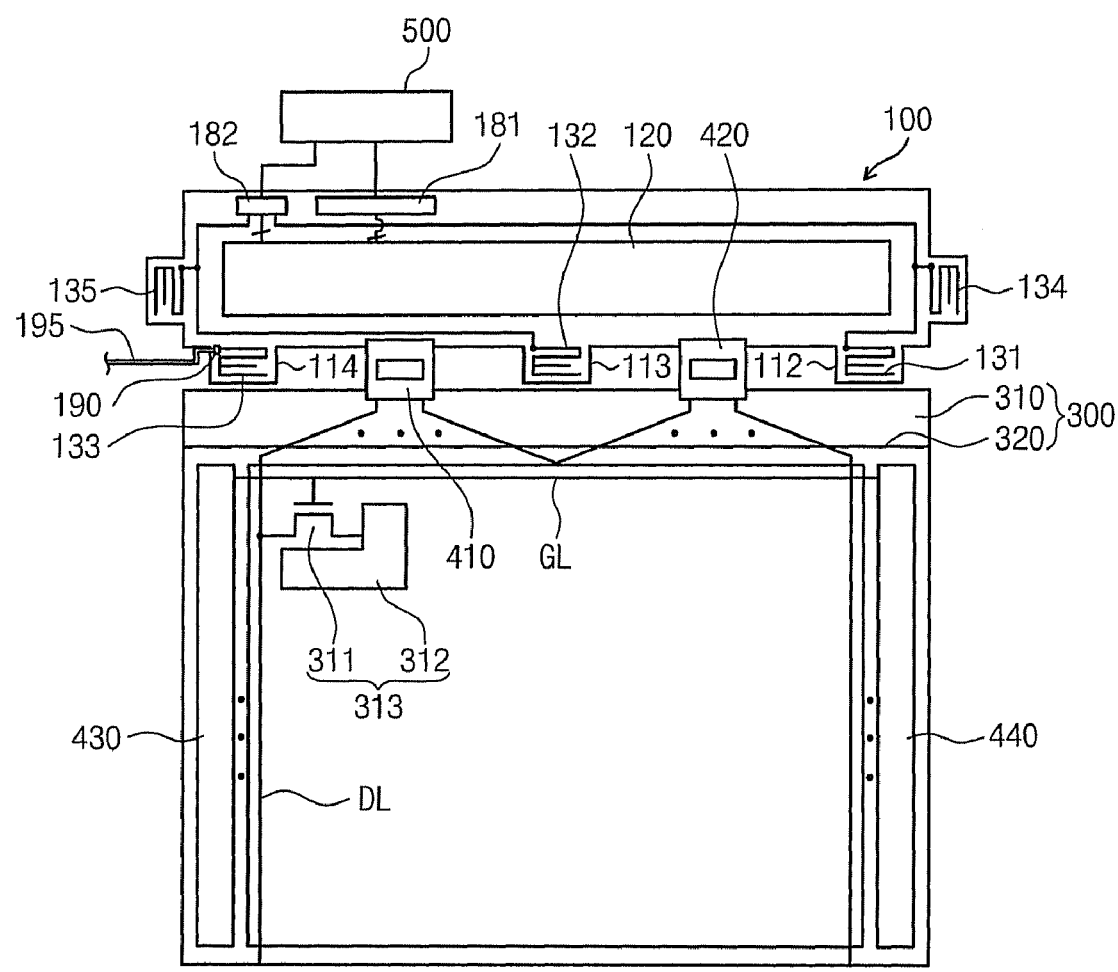
FIG. 7 is a plan view showing a relation between the printed circuit board and a liquid crystal display panel of FIG. 6.

FIG. 7 is a plan view showing a relation between the printed circuit board and the liquid crystal display panel shown in FIG. 6.

Referring to FIGS. 6 and 7, the liquid crystal display panel 300 is arranged on the backlight assembly 200. The liquid crystal display panel 300 includes an array substrate 310, an opposite substrate 320 facing the array substrate 310 and a liquid crystal layer (not shown) interposed between the array substrate 310 and the opposite substrate 320.

The array substrate 310 includes a plurality of gate lines, a plurality of data lines and a plurality of pixels. The pixels are arranged in pixel areas. In an exemplary embodiment, the pixel areas may be defined by the gate and data lines, respectively, but the present invention is not limited thereto. For example, in a first pixel area, a first gate line GL transmits a gate signal, and a first data line DL is intersecting with and insulating from the first gate line GL to transmit a data signal.

A first pixel 313 is formed in a first pixel area, such as may be defined by the first gate line GL and the first data line DL to output a pixel voltage corresponding to images. The first pixel 313 includes a first thin film transistor 311 that is electrically connected to the first gate line GL and the first data line DL to switch the pixel voltage, and a pixel electrode 312 that is electrically connected to a drain electrode of the first thin film transistor 311 to output the pixel voltage.

The printed circuit board 100 is arranged adjacent to a source-side of the liquid crystal display panel 300. In FIG. 7, the printed circuit board 100 has a same structure and function as the printed circuit board 100 shown in FIG. 1, and thus the detailed description of the printed circuit board 100 will be omitted. Alternatively, the printed circuit board of FIG. 7 may be configured as in the illustrated embodiment of FIG. 4.

Referring to FIGS. 1, 2 and 7, the circuit wire portion 120 of the printed circuit board 100 receives an image signal corresponding to the images and outputs a data control signal and a gate control signal.

The first to third protruding portions 112, 113 and 114 of the printed circuit board 100 are arranged adjacent to the array substrate 310, such as adjacent to a side or edge of the array substrate not covered by the opposite substrate 320. Ends of the first and second TCPs 410 and 420 are attached to the printed circuit board 100 and the array substrate 310, respectively, so that the printed circuit board 100 and the array substrate 310 are electrically connected to each other. That is, in a horizontal direction of FIG. 7, the first TCP 410 is arranged between the second protruding portion 113 and the third protruding portion 114, and the second TCP 420 is arranged between the first protruding portion 112 and the second protruding portion 113. The first and second TCPs 410 and 420 receive the data control signal from the circuit wire portion 120 of the printed circuit board 100 to output the data signal to the data lines and provide the gate control signal received from the circuit wire portion 120 to the array substrate 310.

The LCD 700 further includes a first gate driving part 430 and a second gate driving part 440. The first and second gate driving parts 430 and 440 are arranged on the array substrate 310, positioned adjacent to opposing sides of the pixels, respectively, such as in a peripheral portion of the display panel 300, and electrically connected to the gate lines. The first and second gate driving parts 430 and 440 output the gate signal to the gate lines in response to the gate control signal from the first and second TCPs 410 and 420.

Also, the LCD 700 further includes a control printed circuit board 500 that outputs the image signal. The control printed circuit board 500 is electrically connected to the main connector 181 of the printed circuit board 100. The circuit wire portion 120 receives the image signal from the control printed circuit board 500 through the main connector 181.

The control printed circuit board 500 is electrically connected to the inspection connector 182 of the printed circuit board 100. The inspection connector 182 is electrically connected to an external display quality inspection device (not shown) to provide the inspection signal from the display quality inspection device to the circuit wire portion 120. The circuit wire portion 120 provides the inspection signal to the array substrate 310 through the first and second TCPs 410 and 420, and the liquid crystal display panel 300 displays images corresponding to the inspection signal.

The inspection connector 182 is electrically connected to the first, second, fourth and fifth antennas 131, 132, 134 and 135 of the printed circuit board 100 to transmit data between the first, second, fourth and fifth antennas 131, 132, 134 and 135 and the control printed circuit board 500. The control printed circuit board 500 receives the wireless data from the first, second, fourth and fifth antennas 131, 132, 134 and 135 through the inspection connector 182 and stores the received data therein. The control printed circuit board 500 stores the data output through the connection wire portion 140 and 145 connected to the first, second, fourth and fifth antennas 131, 132, 134 and 135, generates the image signal using the stored data, and provides the image signal to the first printed circuit board 100. Also, the control printed circuit board 500 reads out data from a memory (not shown) built-in the LCD 700 and provides the read out data to the first, second, fourth and fifth antennas 131, 132, 134 and 135 through the inspection connector 182. The first, second, fourth and fifth antennas 131, 132, 134 and 135 transmit the received data from the control printed circuit board 500 to an external wireless device (not shown) through the wireless communication network.

Advantageously, the first, second, fourth and fifth antennas 131, 132, 134 and 135 do not need to include an additional connector since the first, second, fourth and fifth antennas 131, 132, 134 and 135 are electrically connected to the control printed circuit board 500 through the inspection connector 182. Since the inspection connector 182 is not used further after the display quality inspection of the LCD 700 is completed, the efficiency of the inspection connecter 182 may be low. However, as a further advantage, since the printed circuit board 100 of the illustrated embodiments transmits data between the first, second, fourth and fifth antennas 131, 132, 134 and 135 and the control printed circuit board 500 through the inspection connector 182, the efficiency of the inspection connector 182 may be improved.

In the present exemplary embodiment, the control printed circuit board 500 is electrically connected to the sub connector 190 of the printed circuit board 100. The sub connector 190 is mounted on the third protruding portion 114 and electrically connected to the third antenna 133 of the printed circuit board 100. The control printed circuit board 500 is electrically connected to the sub connector 190 through the coaxial cable 195, so that the control printed circuit board 500 may transmit data to the third antenna 133. When the coaxial cable 195 connected to the sub connector 190 is electrically connected to an external device, the third antenna 133 may transmit and receive data to and from the external device.

Referring again to FIG. 6, the LCD 700 further includes a top chassis 600 that fixes the liquid crystal display panel 300 to the receiving container 250. The top chassis 600 covers an edge (e.g., a peripheral portion) of the liquid crystal display panel 300 to guide a location of the liquid crystal display panel 300. Also, the top chassis 600 is combined with the receiving container 250 to fix the liquid crystal display panel 300 to the receiving container 250.

Figure 8:
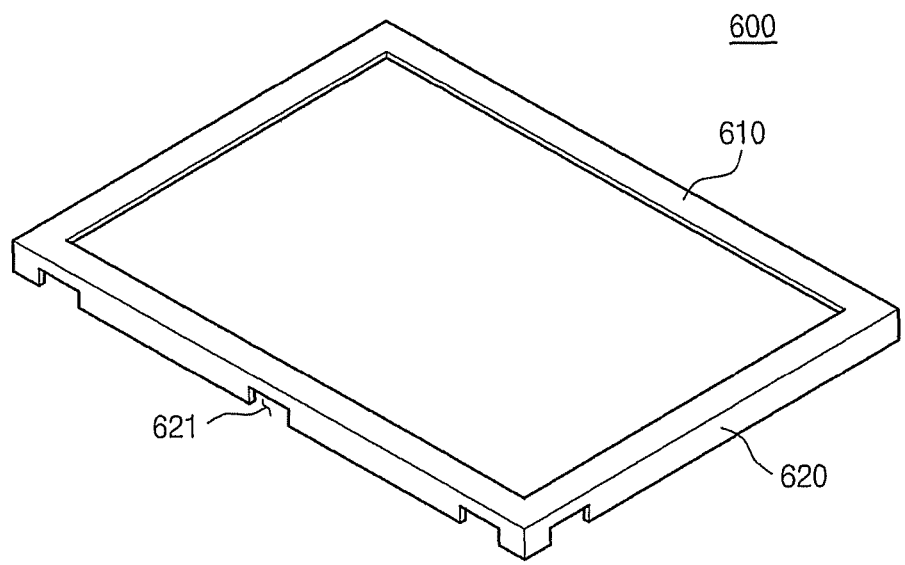
FIG. 8 is a perspective view showing an exemplary embodiment of a top chassis of FIG. 6.
Figure 9:
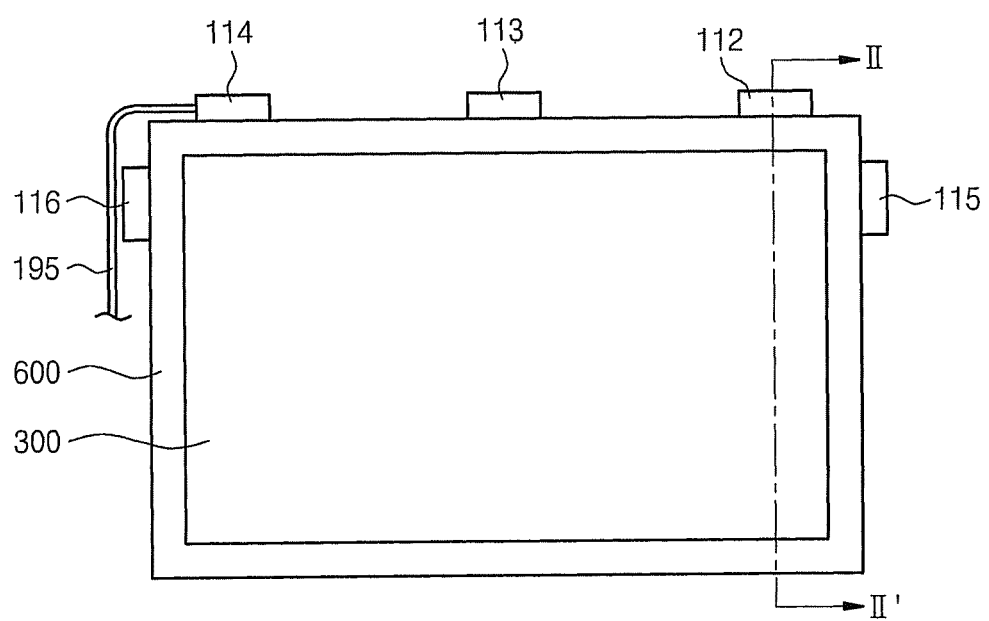
FIG. 9 is a plan view showing the display device of FIG. 6.

FIG. 8 is a perspective view showing an exemplary embodiment of the top chassis of FIG. 6, and FIG. 9 is a plan view showing the display device of FIG. 6.

Referring to FIGS. 8 and 9, the top chassis 600 includes a top surface 610 partially opened and a side surface 620 extended from the top surface 610 to cover the side portion of the liquid crystal display panel 300. The side surface 620 is provided with a plurality of insertion recesses 621 formed corresponding to the first to fifth protruding portions 112 to 116. The first to fifth protruding portions 112 to 116 are protruded to an outside of the liquid crystal display panel 300 through the insertion recesses 621, respectively (FIG. 9). The first to fifth antennas 131 to 135 formed in the first to fifth protruding portions 112 to 116, respectively, are exposed outside of the liquid crystal display panel 300. The first to fifth antennas 131 to 135 are positioned at an upper portion and an upper side portion of the liquid crystal display panel 300 where a receiving rate of radio wave is high in a plan view.

As described above, since the first to fifth antennas 131 to 135 are exposed outside of the LCD 700, the receiving rate of radio wave advantageously increases. Also, the interference of high frequency generated from the printed circuit board 100 and the control printed circuit board 500 may be reduced or effectively prevented and, the noise of the first to fifth antennas 131 to 135 may also be reduced or effectively prevented. Advantageously, data transmission rates for the wireless communication network and communication reliabilities may be improved.

Figure 10:
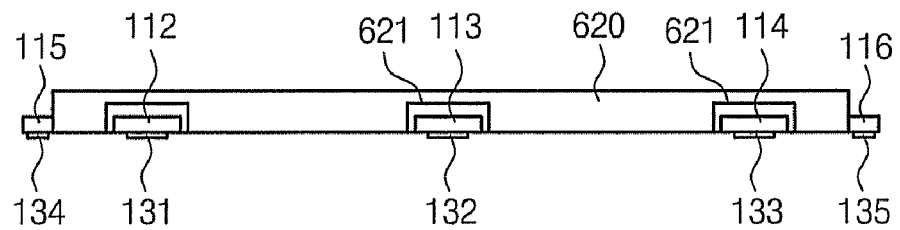
FIG. 10 is a side view showing an exemplary embodiment of a side portion of the display device of FIG. 9.
Figure 11:
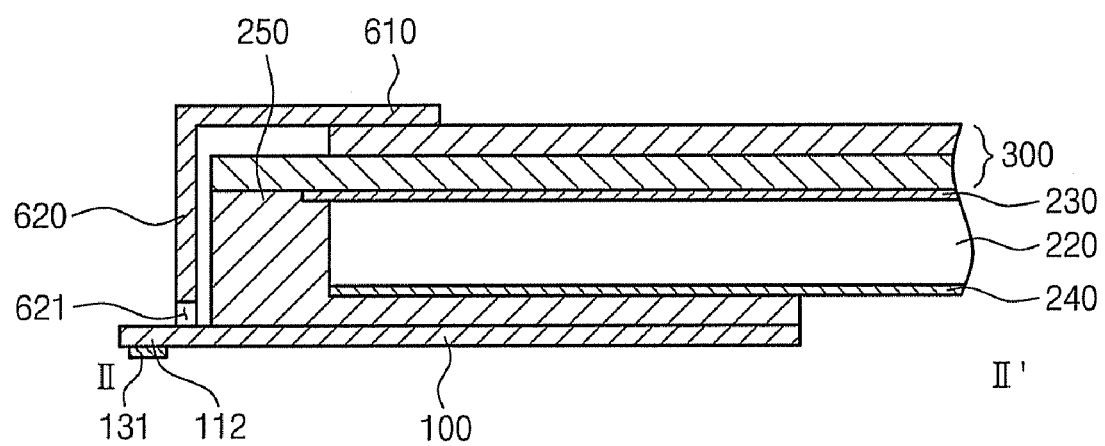
FIG. 11 is a cross-sectional view taken along line II-II' of FIG. 9.

FIG. 10 is a side view showing an exemplary embodiment of a side portion of the LCD of FIG. 9, and FIG. 11 is a cross-sectional view taken along line II-II' of FIG. 9.

Referring to FIGS. 10 and 11, the base portion 111 of the printed circuit board 100 is arranged at a back (e.g., rear) portion of the receiving container 250, and the first to fifth protruding portions 112 to 116 are exposed outside of the receiving container 250.

Referring to FIGS. 9 and 10, the top chassis 600 is spaced apart from and electrically insulated from the first to fifth antennas 131 to 135. When the top chassis 600 makes contact with first to fifth antennas 131 to 135, the noise may occur on the first to fifth antennas 131 to 135, since the top chassis 600 is formed from a conductive metal. In order to reduce or effectively prevent the noise on the first to fifth antennas 131 to 135, surfaces of the top chassis 600, which define the insertion recesses 621, are advantageously spaced apart from the first to fifth protruding portions 112 to 116.

According to the illustrated embodiments, the printed circuit board includes the antenna portion that receives and transmits data through the wireless communication network, and the antenna portion is exposed outside of the liquid crystal display panel. Advantageously, the noise caused by the high frequency generated when the LCD is operated may be reduced or effectively prevented, and the data transmission rate for the wireless communication network may be increased, thereby improving the communication reliabilities.

Also, as a further advantage, since the antenna portion is connected to the control printed circuit board through the inspection connector dually used for an inspection of the display quality of the liquid crystal display panel, the efficiency of the inspection connector may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
    a display panel receiving a control signal corresponding to images and displaying the images;
    a first printed circuit board electrically connected to the display panel and outputting the control signal,
    the first printed circuit board comprising:
        an insulating layer including a base portion and a protruding portion protruded from a side of the base portion;
        a circuit wire portion arranged on the base portion, the circuit wire portion receiving an image signal corresponding to the images from an exterior and outputting the control signal;
        an antenna arranged on the protruding portion and insulated from the circuit wire portion, the antenna receiving and transmitting data through a wireless communication; and
        a connection wire portion arranged on the base portion, electrically connected to the antenna, receiving the data from the antenna, and transmitting the data to the antenna;
    a receiving container receiving the display panel; and
    a top chassis including an insertion recess formed therethrough, such that the protruding portion is inserted into the insertion recess and extends to an outside of the display panel, the top chassis being combined with the receiving container while covering an edge of the display panel, guiding a location of the display panel, and fixing the display panel to the receiving container.

2. The display device of claim 1, wherein the protruding portion extends to the outside of the display panel in a plane view.

3. The display device of claim 1, wherein the first printed circuit board further comprising:
    a first ground layer arranged on the insulating layer and facing the connection wire portion, the insulating layer being disposed between the first ground layer and the connection
    a second ground layer arranged on the connection wire portion.

4. The display device of claim 1, wherein the first printed circuit board further comprising:
    a first ground layer arranged on the insulating layer and facing the connection wire portion; and
    a second ground layer covering an upper portion and a side portion of the connection wire portion.

5. The display device of claim 4, wherein the connection wire portion is electrically connected to the inspection connector, the connection wire portion receiving and transmitting the data from and to the second printed circuit board through the inspection connector.

6. The display device of claim 1, wherein the first printed circuit board further comprising:
    a main connector mounted on the base portion and electrically connected to the circuit wire portion, the main connector receiving the image signal and providing the image signal to the circuit wire portion; and
    an inspection connector mounted on the base portion and electrically connected to the circuit wire portion, the inspection connector receiving an inspection signal for an inspection of display quality of the display panel and provide the inspection signal to the circuit wire portion.

7. The display device of claim 6, further comprising a second printed circuit board electrically connected to the main connector, the second printed circuit board storing the data output from the connection wire portion, generating the image signal using the stored data, and providing the image signal to the first printed circuit board.

8. The display device of claim 7, wherein the connection wire portion is electrically connected to the main connector, the connection wire portion receiving and transmitting the data from and to the second printed circuit board through the main connector.

9. The display device of claim 1, wherein the insulating layer comprises a plurality of protruding portions, the antenna being arranged on each of the protruding portions, the first printed circuit board further comprises a sub connector arranged on one of the plurality of protruding portions and electrically connected to a corresponding antenna of the one protruding portion, and the antenna connected to the sub connector is insulated from the connection wire portion.

10. The display device of claim 1, wherein the protruding portion is positioned at an upper portion or an upper side portion of the display panel in a plane view.

11. A display device comprising:
    a display panel receiving a data signal and a gate signal corresponding to images to display the images;
    a gate driving circuit receiving a gate control signal corresponding to the images and outputting the gate signal to the display panel;
    a data printed circuit board generating the gate control signal and a data control signal in response to an image signal corresponding to the images, the data printed circuit board being electrically connected to the display panel,
    the data printed circuit board comprising:

an insulating layer including a base portion and a protruding portion protruded from a side of the base portion;

a circuit wire portion arranged on the base portion, receiving the image signal and outputting the gate control signal and the data control signal;

an antenna arranged on the protruding portion and insulated from the circuit wire portion, and receiving and transmitting data through a wireless communication; and a connection wire portion arranged on the base portion and electrically connected to the antenna, and receiving the data from the antenna and transmitting the data to the antenna;

a receiving container receiving the display panel; and a top chassis including an insertion recess formed therethrough, such that the protruding portion is inserted into the insertion recess and extends to an outside of the display panel, the top chassis being combined with the receiving container while covering an edge of the display panel, guiding a location of the display panel, and fixing the display panel to the receiving container.

12. A method of forming a display device displaying images, the method comprising:

forming a display panel receiving a control signal corresponding to the images and displaying the images;

forming a printed circuit board including:

forming an insulating layer including a base portion and a protruding portion extended from a side of the base portion;

arranging a circuit wire portion on the base portion, the circuit wire portion receiving an image signal corresponding to the displayed images from an exterior and outputting the control signal;

disposing an antenna on the protruding portion, the antenna receiving and transmitting data through a wireless communication; and arranging a connection wire portion on the base portion, the connection wire portion being electrically connected to the antenna, receiving the data from the antenna, and transmitting the data to the antenna;

electrically connecting the display panel and the printed circuit board;

combining a receiving container receiving the display panel with a top chassis such that the top chassis covers an edge of the display panel and guides a location of the display panel to fix the display panel to the receiving container, and the top chassis including an insertion recess formed therethrough such that the protruding portion is inserted into the insertion recess and extends to an outside of the display panel.

* * * * *